United States Patent [19]

Byrd

[11] 4,439,282

[45] Mar. 27, 1984

[54] TREATMENT OF METALS TO ENHANCE ADHESIVE BONDING

[75] Inventor: Norman R. Byrd, Villa Park, Calif.

[73] Assignee: McDonnell Douglas Corporation, Long Beach, Calif.

[21] Appl. No.: 383,504

[22] Filed: Jun. 1, 1982

[51] Int. Cl.³ .......................... C25D 5/00; C25D 5/44; C23F 7/06

[52] U.S. Cl. ............... 204/38 R; 148/6.14 R; 148/6.27; 427/436; 156/150; 204/33; 204/181 R

[58] Field of Search ............. 204/181 R, 181 C, 33, 204/38 R; 427/436; 148/6.14 R, 6.27; 156/150, 151

[56] References Cited

U.S. PATENT DOCUMENTS

| | | | |
|---|---|---|---|
| 27,896 | 1/1874 | Rausch et al. | 204/181 R |
| 2,871,171 | 1/1959 | Nesbitt | 204/33 |
| 2,976,193 | 3/1961 | Pimbley | 148/6.27 |
| 3,066,055 | 11/1962 | Pimbley | 148/6.27 |
| 3,502,511 | 3/1970 | Forsberg | 204/181 R |
| 3,544,440 | 12/1970 | Weigel | 204/181 R |
| 3,775,265 | 11/1973 | Bharucha et al. | 204/33 |
| 4,052,309 | 10/1977 | Holzer et al. | 204/181 R |
| 4,163,679 | 8/1979 | Nagae et al. | 148/6.27 |
| 4,171,393 | 10/1979 | Donley et al. | 427/436 |
| 4,180,442 | 12/1979 | Byrol | 204/181 R |
| 4,273,592 | 6/1981 | Kelley | 148/6.27 |
| 4,388,156 | 6/1983 | Gillich et al. | 204/38 R |

Primary Examiner—Howard S. Williams
Assistant Examiner—Terryence Chapman
Attorney, Agent, or Firm—Max Geldin

[57] ABSTRACT

A process for enhancing adhesive bonding of a metal substrate, particularly aluminum, which comprises treating the aluminum substrate, after optional cleaning thereof in an alkaline solution, with an ammoniacal solution of a copper salt, e.g. copper sulfate, to form a cuprammonium, i.e. $[Cu(NH_3)_4]SO_4$, solution containing the complex $Cu(NH_3)_4^{++}$ ion. Such treatment provides a controlled etch of the aluminum substrate and increases the surface area thereof, resulting in enhanced reactivity of each surface with an adhesive during adhesive bonding, and providing a strong adhesive bond between the adhesive coating and the metal substrate. When such cuprammonium treatment of an aluminum surface is followed by electrodeposition of an organic coating, as described in U.S. Pat. No. 4,180,442, prior to application of an adhesive coating, a strong adhesive bond having consistently high lap shear values is obtained.

25 Claims, No Drawings

TREATMENT OF METALS TO ENHANCE ADHESIVE BONDING

BACKGROUND OF THE INVENTION

This invention relates to surface treatment of a metal substrate, particularly aluminum, prior to application of an adhesive to the substrate, and is particularly directed to a process for the treatment of a metal substrate such as aluminum, to enhance subsequent adhesive bonding, by means of a chemical treatment which permits a controlled etching of the substrate surface and a uniform increase in surface area.

The adhesion of polymers (as adhesives) to metal substrates is, generally, a complex process. Usually, the metal surface has to be pretreated, and the adhesive has to have sufficient activity for the mating of the two to result in an optimum bond. Substrates, e.g. metals, have to be prepared for this union of such two dissimilar materials as a polymer and a metal by first cleaning and then etching the metal, and, as in the case of aluminum, by anodizing (oxidizing) or other surface treatment such as the so-called FPL etch, employing a solution of sodium dichromate in sulfuric acid. These treatments have the effect of increasing surface area in order to enhance mechanical interaction between the polymer and the metal substrate. Where mechanical interactions alone between the metal and polymer coating are involved, due primarily to surface roughening, the resulting bond strength is relatively weak.

Thus, surface treatment of metal substrates for subsequent application to adhesive bonding or painting has become a very important problem. With the advent of controlled oxidation techniques, i.e. anodization or other oxidative etching techniques, such as the well-known FPL etch noted above, or phosphoric acid anodization, among others, surface preparation has become a relatively simple matter. However, when bonding or coating on such a prepared surface, the majority of the methods take advantage of physical or mechanical bonding to the substrate, resulting in a relatively weak bond between the metal and polymer adhesive, as opposed to having a true chemical bond between the substrate and the adhesive.

U.S. Pat. No. 4,180,442 discloses electrodeposition of a coating of an organic compound or polymer on a metal such as aluminum. The polymer coating has a strong chemical bond to the metal substrate, and also has functional groups for bonding to an adhesive, enabling a total chemical bond to be formed via such coating between the metal substrate and the adhesive. However, lap shear values measuring the strength of the adhesive bond to such coated substrates have varied from as high as over 5300 psi to as low as about 3000 psi. Thus, in order to obtain more consistently high lap shear values, it became evident that surface roughness or high surface area is highly important.

In adhesive bonding to a metal, such as aluminum, it is usually necessary to pretreat the metal surface by cleaning it with a degreaser, followed by an alkaline clean and etch, and then by a deoxidizing process, followed by either anodizing it or subjecting it to a surface treatment such as FPL etch. Subsequently, these surfaces are normally treated with a primer to effect a mechanical bond between the substrate and the primer, and then an adhesive is applied to the primer. In the process of the above patent one proceeds from the deoxidized surface directly to the electrodeposition of the organic coating without passing through the surface preparation technique of oxidation. It is because of this that in the practice of the process of the above patent, electrodeposition takes place principally on a surface of variable roughness, thereby resulting in variable values in the lap shear bond tests.

Since the electrodeposition of a coating procedure according to the above patent does not utilize an oxidized, e.g. anodized surface as a precursor to the electrodeposition step, the surface of the substrate is only as rough as it is when received from the mills. The only pretreatment of the substrate normally is to subject the substrate surface to a cleaning and a deoxidizing process, as noted above.

Thus, to provide chemical bonding from the metal through to the adhesive, as opposed to the physical bond formed with oxides, a chemical treatment is needed that will etch the surface, as well as deposit a chemical compound that will function as an "active" surface for the electrodeposition process. This, then, would create a high surface area substrate that has a chemical compound attached chemically, and that will, in turn, chemically bond to the adhesive.

Numerous methods are known for increasing the surface area of a substrate, and roughening a surface, such as by sanding, for example, but it is difficult to perform in a production line system. Furthermore, it does not create a uniform surface. Aside from the oxidation methods described above, there are very few other techniques for increasing surface area in a uniform manner.

Generally, in a galvanic cell, one element is present as an ionic species and the other is metal. Then, if the electromotive force of the cell is such that one part of the cell has a lower reduction potential than the other, the reducing element will reduce the ion in solution to the metallic state and the reducing element will become oxidized and go into solution. Thus, it is well known that metallic zinc will reduce copper ions to copper metal, and the zinc metal will go into solution. Similarly, metallic aluminum will reduce copper ions to copper metal, and the aluminum will go into solution. In the case of a sheet of aluminum (or its alloy), in a copper salt solution, there will result a severely pitted aluminum sheet with large masses of copper attached to its surface, and this action will continue as long as there are copper ions in the solution.

Accordingly an object of the present invention is the treatment of a metal surface such as aluminum by a chemical procedure to enhance adhesive bonding to the metal. Another object is the provision of procedure for chemically etching the surface of a metal such as aluminum so as to uniformly attack the surface of the metal and to increase the surface area of the metal in a uniform manner. A further object is to provide a chemical treatment for metals such as aluminum, which will etch the surface uniformly, and also deposit a chemical compound which will also function as an "active" surface for the electrodeposition process of the type described in the above patent. Yet another object is a chemical treatment procedure for a substrate such as aluminum which creates a high surface area substrate having a chemical compound attached chemically thereto which will in turn chemically bond to an adhesive. A still further object is the provision of a chemical treatment procedure of the type noted above which uniformly attacks the surface of a substrate and provides a high surface area, in conjunction with electrodeposition of a coating to provide a chemical bond for an adhesive coating resulting in more consistently high lap shear values in adhesive bonding tests.

SUMMARY OF THE INVENTION

The invention concept resides in a method of obtaining a controlled surface reaction such that no pitting of the aluminum surface occurs, and in the absence of large masses of copper depositing on and growing out of the substrate surface. More specifically, the above objects and advantages are achieved by a process involving an electrochemical oxidation reaction which permits a controlled "etching" of the substrate, e.g. aluminum, surface to occur with the consequent deposition of a moiety or chemical compound on the resulting "etched" surface which prevents the etching from proceeding too far and from becoming destructive.

The invention concept preferably involves the use of an ammoniacal solution of a copper salt, e.g. copper sulfate, dissolved in ammonium hydroxide to form a cuprammonium solution, i.e. $[Cu(NH_3)_4{}^{++}]SO_4$ solution. In this form, the cupric ion is tied up as a complex, and it is not readily available for the redox reaction that would normally occur with $Cu^{++}$ and aluminum metal. In fact, the concentration of the simple cupric ion at 25° C. is $10^{-14}$ molar, when complexed with ammonia (i.e. of the cupric ions present in solution, only 1 in $10^{11}$ atoms is not combined with ammonia) [C. Immerwahr, Z. anorg. Chem 24, 269 (1900)]. Thus, whether the small amount of free cupric ions present are capable of a slow, controlled oxidation of the aluminum surface, or if the cuprammonium ion is capable of a unique "etching" of the aluminum is not absolutely known. What is known, however, is that the surface texture of the aluminum changes to a somewhat highly convoluted form, indicative of some morphological change, and a consequent enhanced reactivity of the surface in adhesive bonding. This ties in with the fact that cuprammonium ion is known to be a strong oxidizing agent.

It has been found, as shown in greater detail hereinafter, that cuprammonium treatment of aluminum to obtain a controlled etched and uniformly increased surface area, followed directly by bonding with an adhesive, such as an epoxy adhesive, provides a strong chemical bond between the adhesive and the substrate surface, having high lap shear values. However, it has been found that cuprammonium treatment, followed by electrodeposition, particularly provides more consistently good lap shear test results when adhesive bonding was effected after the electrodeposition of organics on the aluminum substrate.

DETAILED DESCRIPTION OF THE INVENTION AND PREFERRED EMBODIMENTS

The metal substrate, particularly aluminum, to be subjected to treatment according to the invention, is first subjected to a cleaning and deoxidizing procedure. The initial cleaning step for removal of grease and surface dirt can be carried out by treatment with Chlorosolve, a mixture of dichloromethane and isopropyl alcohol, or with methyl ethyl ketone (MEK). Thereafter, the substrate is treated in an alkaline cleaner. For this purpose, caustic alkali, e.g. sodium hydroxide, can be employed, noting that this material is very active particularly on aluminum substrates.

Another illustrative cleaning procedure can include treatment first with methyl ethyl ketone followed by treatment with "Alconox", a slightly basic soapy material containing a phosphate other than trisodium phosphate, followed by treatment with NaOH.

Another cleaning procedure is the use of "Comet", a commercial alkaline cleaner containing a gritty material as an abrasive plus a hypochlorite, optionally followed by treatment with NaOH solution.

In carrying out the cuprammonium ion oxidation of the substrate, preferably aluminum, according to the invention, the solution employed can range in copper ion concentration, from 0.001 to 1.5 molar. A preferred copper ion concentration ranges from about 0.1 to 1.0 molar. The ratio of ammonia to copper in such solution can be the stoichiometric ratio of 4 to 1 for the complex $Cu(NH_3)_4{}^{++}$ ion. However, such ratio can range from 2 to 1 to 8 to 1, preferably 4 to 1 to 8 to 1. The above noted stoichiometric ratio of 4 to 1 of ammonia to copper particularly is employed for obtaining greater lap shear values for the adhesive bond.

Thus, Table 1 below illustrates lap shear values obtained following bonding with an epoxy resin, of an aluminum substrate initially treated according to the invention by oxidation in a cuprammonium solution at various molar copper ion concentrations ranging from 0.001 to 1.0, employing a ratio of ammonia to copper ranging from 1 to 1 to 8 to 1.

TABLE I

| Molar Copper Ion Concentration | Ratio of $NH_3$ to Cu | Lap Shear Values, psi |
| --- | --- | --- |
| 1.0 | 4:1 | 5,796 |
| 0.6 | 8:1 | 4,895 |
| 0.6 | 4:1 | 5,024 |
| 0.3 | 4:1 | 4,763 |
| 0.3 | 8:1 | 4,500 |
| 0.2 | 8:1 | 5,225 |
| 0.2 | 1:1* | 4,700 |
| 0.2 | 2:1 | 4,335 |
| 0.2 | 4:1 | 5,120 |
| 0.1 | 8:1 | 4,690 |
| 0.1 | 4:1 | 4,980 |
| 0.001 | 4:1 | 4,000 |

*Some pitting on surface

From the above table, it is seen that consistently high lap shear values were obtained for the copper ion concentrations ranging from 0.1 to 1.0 molar, and generally best results were obtained between the stoichiometric ratio of 4:1 to 8:1 of ammonia to copper in the solution.

As previously noted, the cuprammonium oxidation procedure of the present invention can also be employed in conjunction with electrodeposition of an organic coating or polymer, as described in above U.S. Pat. No. 4,180,442 or in Application, Ser. No. 317,162, filed Nov. 2, 1981, by Norman R. Byrd. The disclosure of the above mentioned patent and application are incorporated herein by reference. Thus, as disclosed in the above patent, electrodeposition is carried out employing a metal substrate, e.g. aluminum, as the anode, the cathode being, for example, platinum or carbon. Either direct current or alternating current can be employed in the electrodeposition, preferably direct current. Electrolytic voltages employed can range from about 1 to as high as 300 volts. The electrodeposition reaction is carried out according to this patent in non-aqueous media.

The electrodeposition reaction of such patent accordingly comprises passing an electric current through a non-aqueous electrolyte in which said aluminum substrate is the anode, the aluminum of said substrate being capable of forming an organometallic compound, said electrolyte containing an organic compound having a labile hydrogen, and capable of generating an anion during electrolysis, and an inert organic solvent for said compound and electrodepositing a coating of said compound on said metal substrate, wherein said anion is reacted with and is chemically bonded to the metal of said substrate. The electrolyte contains an organic compound selected from the class consisting of (a) carboxyl substituted aminosilanes, (b) butylamine reaction products with phthalic anhydride, decylamine reaction products with phthalic anyhdride, and carboxyl terminated butadieneacrylonitrile copolymer, and (c) phenyl phosphonic acid, and dimethyl phosphite, as their triethylamine salts, and sulfonic acid compounds.

The electrodeposition of the organic coating on the metal substrate, e.g. aluminum, takes place very rapidly, e.g. within about 1 minute and forms an organometallic compound, either monomeric or polymeric with the metal substrate, and such coating facilitates subsequent adhesive bonding to the substrate.

A similar electrodeposition process is disclosed in the above application Ser. No. 317,162 employing a non-aqueous or aqueous electrolyte containing a phosphorylated amide having a labile hydrogen, and capable of generating an anion during electrolysis, said phosphorylated amide being in the form of (a) an organic polymer consisting of a poly (phosphinohydrazide), a poly (phosphinoguanide) or a poly (phosphinoureide), including homopolymers and copolymers thereof, and their thio analogs, or (b) a 2:1 molar adduct of two moles of a nitrogen-containing compound of the group consisting of hydrazine, guanidine and urea, and its thio analog, to one mole of an organic phosphite or phosphonate, and their thio analogs, and electrodepositing a coating of said amide on said metal substrate wherein said anion is reacted with and is chemically bonded to the metal of said substrate. The number of recurrent units in the homopolymers and copolymers can range from about 3 to about 20.

A particularly preferred amide of the above class is the reaction product from one mole of dimethylphosphite with one mole of hydrazine hydrate, or two moles of hydrazine hydrate with one mole of dimethylphosphite. A non-aqueous electrolyte containing an inert organic solvent such as dimethylformamide or ethylene glycol is preferably employed, electrodeposition being carried out at a voltage ranging from about 1.5 to about 100 volts, for a period up to not more than about 5 minutes. The phosphorylated amide forms an organo-metallic compound with the aluminum of the anode during electrodeposition.

A series of tests, the results of which are shown in Table II below, were carried out to provide lap shear values when adhesive bonding was effected after cuprammonium ion oxidation of aluminum according to the invention, with or without subsequent electrodeposition, as compared to control surfaces of aluminum (a) which had no treatment other than cleaning with Chlorosolve or methyl ethyl ketone(MEK); (b) which were cleaned by normal processing procedure including solvent wipe with MEK, followed by alkaline cleaning with a proprietary cleaner (Turco 4215) at 145°–155° F. for 15 minutes and rinsing in warm water at 110° F., followed by treatment with a deoxidizer such as Amchem 616; and (c) which were cleaned by the conventional procedure of (b) above, followed by FPL etch or oxidizing treatment, employing a solution of sodium dichromate in sulfuric acid.

To obtain lap shear values, the various control strips and strips treated with cuprammonium solution according to the invention, with and without electrodeposition, were bonded with FM73 (epoxy tape) adhesive in an autoclave at 40 psi and 240° F. for 90 minutes. In each test, a pair of strips of the same type were adhesively bonded together, and the cured adhesively connected pairs of strips were then subjected to single lap shear tests.

TABLE II

| ALUMINUM PROCESSING TECHNIQUES ON 2024T3 CLAD ALUMINUM | NO CUPRAMMONIUM PRETREATMENT OF ALUMINUM | | CUPRAMMONIUM PRETREATMENT | | |
|---|---|---|---|---|---|
| | VOLT-AGE[6] | LAP SHEAR (psi)[3] | VOLT-AGE[6] | CONCENTRATION OF CUPRAMMONIUM | LAP SHEAR (psi)[3] |
| No surface treatment other than MEK cleaning | — | 1,500 | — | .1M (Molar) | 4,380 |
| No surface treatment other than MEK cleaning | — | — | — | .01M | 4,400 |
| Cleaned by normal processing procedure | — | 1,000 | — | — | — |
| Cleaned by normal processing procedure and given standard FPL etch treatment | — | 5,000 | — | — | — |
| Electrodeposition of 1:1 DMP/H[1] [2] | 1.5 | 2,000 | 1.5 | .3M | 4,700 |
| " | 1.5 | 1,250 | — | — | — |
| " | 5 | 1,100 | — | — | — |
| " | 7 | 2,000 | 7 | .3M | 4,900 |
| " | 10 | 3,680 | 10 | .05M | 4,800 |
| " | 15 | 2,250 | 15 | .3M | 3,800 |
| " | 20 | 3,100 | 20 | .005M | 4,400 |
| " | 30 | 2,700 | — | — | — |
| " | 50 | 3,000 | 50 | .05M | 4,700 |
| " | — | — | 100 | .05M (Molar) | 5,100 |
| Electrodeposition of 2:1 H/DMP[4] | 1.5 | 1,900 | — | — | — |
| " | 7 | 2,200 | 7 | .3M | 3,700 |
| " | 15 | 2,300 | 15 | .3M | 3,500 |
| " | 30 | 1,600 | 30 | .3M | 4,000 |
| " | 30 | 2,700 | — | — | — |

TABLE II-continued

| ALUMINUM PROCESSING TECHNIQUES ON 2024T3 CLAD ALUMINUM | NO CUPRAMMONIUM PRETREATMENT OF ALUMINUM | | CUPRAMMONIUM PRETREATMENT | | |
|---|---|---|---|---|---|
| | VOLT-AGE[6] | LAP SHEAR (psi)[3] | VOLT-AGE[6] | CONCENTRATION OF CUPRAMMONIUM | LAP SHEAR (psi)[3] |
| Electrodeposition of 1:1 DMP/H[5] | 15 | 3,000 | 15 | .3M | 3,500 |

[1] Reaction product from one mole of dimethylphosphite with one mole of hydrazine hydrate (1:1 DMP/H)
[2] Non-aqueous electrodeposition process
[3] Average value of three lap shear tests
[4] Reaction product from two moles of hydrazine hydrate with one mole of dimethylphospite (2:1 H/DMP)
[5] Aqueous electrodepositions
[6] Electrodeposition voltage Note from Table II above, the high lap shear values obtained employing the cuprammonium procedure of the invention, and particularly when such procedure is employed in conjunction with electrodeposition, wherein consistently high lap shear values were obtained, using the reaction product of one mole of dimethylphosphite with one mole of hydrazine hydrate.

Other cleaning procedures, prior to cuprammonium treatment, which can be utilized include (1) solvent wipe with MEK followed by cleaning in Alconox at 5% concentration for 10 minutes at 60° C.; (2) wiping the surface with MEK and then scrubbing with Comet followed by a 5 minute rinse in deionized water, then a 5 minute dip in sodium hydroxide at either a 5%, 10% or 20% concentration, and then a 5 minute rinse in deionized water, followed by a 20 second dip in 10% NH₄OH, then a 5 minute rinse in deionized water; (3) same as (2) above but without the Comet treatment; (4) a combination of (1) and (3) above; and (5) treatment with MEK or Chlorosolve followed by treatment with NaOH, a water rinse, and then an acid rinse, such as nitric, phosphoric, acetic or sulfuric acid solution.

Although aluminum is the preferred substrate employed according to the invention process, the process is applicable to any metallic surface that is above copper in the electromotive series and where an oxidized surface is required for enhancing adhesive bonding to the substrate. The invention process is also applicable to such substrates or surfaces as stainless steel, utilizing tetravalent tin as the oxidizing agent, in a solution of a soluble tin salt such as stannic chloride. Thus, the concept of electrochemical oxidation, although specifically directed in the present disclosure to cupric ions and aluminum, has broader applicability to various oxidizing agents and metallic substrates or surfaces.

The following are additional examples of practice of the invention process:

EXAMPLE I

In order to demonstrate the beneficial effects of the electrochemical oxidation by the use of the cuprammonium process, a series of tests were initially performed using various cleaning and surface treating procedures, but without use of the cuprammonium ion solution. Since the first step of the process always consisted of a solvent wiping of the aluminum surface with methyl ethyl ketone (MEK), strips of 2024-T3 clad aluminum were wiped with MEK, dried and bonded with FM73 epoxy adhesive tape. The average lap shear value of three specimens was 1500 psi with one percent cohesive failure in the adhesive. The percent cohesive failure is a measure of the degree of adhesion to the substrate. The higher the cohesive failure values, the better the adhesion. In other words, the failure mode is in the adhesive, not at the interface between the adhesive and the substrate.

Another set of 2024-T3 clad aluminum strips were wiped with MEK, dipped in a 5 percent solution of "Alconox" for 10 minutes at 60° C., rinsed in deionized water for 5 minutes, air dried and bonded with FM73 epoxy. The lap shear was an average of 4000 psi. The failure mode was about 65 percent cohesive.

In another series of experiments, the Al was first MEK wiped then dipped in either a 5 percent, 10 percent or 20 percent sodium hydroxide solution for either 2 minutes, 3 minutes, or 5 minutes, rinsed in deionized water for 5 minutes, air dried and bonded with FM73 epoxy. The average lap shear values were 3000 psi with about 50 percent average cohesive failure in the adhesive.

An experiment was also performed where an abrasive was used for surface treating the aluminum as part of the cleaning process. In this case, the 2024-T3 clad Al strips were wiped with MEK and then scrubbed with "Comet". This was followed by a 5 minute rinse in deionized water, then the strips were air dried and bonded with FM73 epoxy. The average lap shear value was 2000 psi with about 10 percent cohesive failure in the adhesive.

EXAMPLE II

The effect of the cuprammonium ion on the activation of aluminum substrates was then examined. In Example I results were given for the lap shear obtained on 2024-T3 clad aluminum with only a MEK wipe. The same treatment was given to another set of 2024-T3 clad aluminum strips followed by a 10 minute dip in the 0.2 molar cuprammonium sulfate solution (4:1 ammonium hydroxide to copper ion), then a 5 minute rinse in deionized water, dried and bonded with FM73 epoxy; the average lap shear was 4300 psi with about 80 percent cohesive failure.

EXAMPLE III

In Example I it was demonstrated that when the aluminum was dipped into a 5 percent "Alconox" solution at 65° C. for 10 minutes lap shears of around 4000 psi were obtained. Using the same process as in Example I, viz., a MEK wipe, a 10 minute dip into a five percent solution of "Alconox" at 65° C. for 10 minutes, then a 5 minute rinse in deionized water and then a 20 second rinse in 10% NH₄OH, followed by 10 minutes in 0.2 molar (4:1) cuprammonium ion solution, then a 20 second rinse in 10% NH₄OH, a 5 minute rinse in deionized water and air dried, the FM73 bonded strips had an average lap shear of 5100 psi with a 100 percent cohesive failure of the adhesive bond.

EXAMPLE IV

Repeating the same procedure of Example III, but using an 8:1 ratio of ammonium hydroxide to copper ion, the lap shear values were about 4940 psi with 100 percent cohesive failure of the adhesive bond.

EXAMPLE V

In Example I, the effect of sodium hydroxide solution pretreatment on aluminum was demonstrated. Repeating the treatment with sodium hydroxide but adding a 20 second dip in 10 percent NH4OH solution followed by a 10 minute dip in cuprammonium sulfate solutions of varying molarities ranging from 0.001 to 1:5, and 4:1 ammonia to copper ion ratios, then another 20 seconds dip in 10 percent NH4OH, a 5 minute rinse in deionized water, dried and bonded with FM73 epoxy, the lap shears averaged 5000 psi with about 90 percent cohesive failure.

EXAMPLE VI

In Examples III and V, the effects of "Alconox" and sodium hydroxide, separately, were determined. In this example, both the "Alconox" and sodium hydroxide pretreatment were combined prior to the cuprammonium dip. The aluminum was first wiped with MEK then dipped into a 5 percent "Alconox" solution at 60° C. for 10 minutes. This was followed by a 5 minute rinse in deionized water, then a 5 minute dip in 20 percent sodium hydroxide solution at room temperature. After a 5 minute rinse in deionized water, then a 20 second dip in 10 percent NH4OH followed by a 10 minute dip in a 0.2 molar (4:1) cuprammonium sulfate solution, a 20 second dip in 10 percent NH4OH, a 5 minute rinse in deionized water and air dried, the average lap shears were about 5200 psi with a 98 percent cohesive failure in the adhesive bond.

EXAMPLE VII

In Example I it was demonstrated that a pretreatment cleaning of the aluminum with MEK and "Comet" cleanser gave lap shear values of about 2000 psi. Repeating the process of Example I with the "Comet" cleanser, but adding a 5 minute rinse in deionized water then a 10 minute dip in a 0.2 molar (4:1) cuprammonium sulfate solution, followed by a 20 second dip in a 10 percent ammonium hydroxide solution, then a 5 minute rinse in deionized water, air drying and bonding with FM73 epoxy adhesive, the average lap shear was 4700 psi with about 80 percent cohesive failure.

EXAMPLE VIII

In this Example, a number of tests were evaluated with regard to the effect of the length of time the aluminum was in the cuprammonium solution. The first test was the effect of immersion in the 0.2 molar (4:1) cuprammonium sulfate solution after a pretreatment cleaning with the five percent "Alconox" solution. The 2024-T3 clad aluminum was wiped with MEK then dipped into a five percent "Alconox" solution for 10 minutes, at 40° C. The aluminum was then rinsed for 5 minutes in deionized water, followed by either a one minute, 15 minute or 30 minute dip in the 0.2 molar (4:1) cupramonium sulfate solution, then a 5 minute rinse in deionized water, air dried and bonded with FM73 epoxy. The lap shears averaged about 5000 psi with about 95 percent cohesive failure in the adhesive bond.

In the next test, the aluminum was wiped with MEK, then dipped in 10 percent sodium hydroxide for three minutes followed by a five minute rinse in deionized water, a 20 second dip in 10 percent NH4OH solution, then a one minute, 15 minute or 30 minute dip in the 0.2 molar (4:1) cuprammonium sulfate solution. This was followed by a 20 second dip in 10 percent NH4OH, a five minute rinse in deionized water, air dried and bonded with FM73 epoxy. The average lap shear was about 4500 psi with about 60 percent cohesive failure.

The next test was concerned with the effect of exposure time to the cuprammonium solution after a pretreatment cleaning with both "Comet" cleanser and sodium hydroxide. The aluminum was wiped with MEK, scrubbed with the "Comet" cleanser, rinsed in deionized water for five minutes, then dipped in five percent sodium hydroxide for five minutes followed by a five minute rinse in deionized water, a 20 second dip in 10 percent NH4OH solution, then a one minute, 15 minute or 30 minute dip in the 0.2 molar (4:1) cuprammonium sulfate solution. This was followed by a 20 second dip to 10% NH4OH, a five minute rinse in deionized water, air dried and bonded with FM73 epoxy. The average lap shear was 4780 psi with about 85 percent cohesive failure.

EXAMPLE IX

Subsequent to the treatment of the aluminum with a cuprammonium solution, the bonding of a cuprammonium treated aluminum that also has had an organophosphorous polymer electrodeposited onto its surface was evaluated. For this purpose, 2024-T3 clad aluminum was wiped with MEK, dipped in a 0.05 molar (4:1) cuprammonium sulfate solution for 10 minutes, dipped in a 10 percent ammonium hydroxide solution for 20 seconds, rinsed in deionized water for five minutes and air dried. The aluminum was placed in a 0.25 molar solution of poly (phosphinohydrazide) (1:1 DMP/H) (prepared by reacting one mole of dimethylphosphite with one mole of hydrazine hydrate) in 400 mls ethylene glycol and having 0.25 moles of triethylamine. The aluminum strips, as the anode, with platinum (or carbon) as the cathode, were subjected to a potential of 10 volts for five minutes. The result was an electrodeposited coating of the poly (phosphinohydrazide) (1:1 DMP/H) onto the cuprammonium treated aluminum. The electrodeposited coating was washed in ethylene glycol for five minutes, methyl alcohol for five minutes and finally another methyl alcohol wash for five minutes. The dried aluminum was then bonded with FM73 epoxy. The average of three lap shear specimens was 4800 psi. Repeating the same electrodeposition process, but omitting the cuprammonium treatment, the lap shears were 3680 psi.

EXAMPLE X

In another test wherein the aluminum was first treated with a cuprammonium solution and then electrodeposited with a phosphinohydrazide compound, analogous to Example IX, the aluminum was precleaned with MEK and treated with a 0.3 molar solution of cuprammonium sulfate solution, as described in Example IX. The aluminum was then placed in a 0.25 molar solution of a 2:1 H/DMP (prepared by reacting one mole of dimethylphosphite with two moles of hydrazine hydrate) in 400 mls ethylene glycol and having 0.25 moles of triethylamine. The aluminum as the anode, with platinum (or carbon) as the cathode, was subjected to a potential of 30 volts for five minutes. The result was an electrodeposited coating of the 2:1 (phosphinodihydrazide) onto the cuprammonium treated aluminum. The electrodeposited coating was washed in ethylene glycol for five minutes, methyl alcohol for five minutes and finally another methyl alcohol wash for five minutes. The dried aluminum was then bonded with FM73 epoxy. The average of three lap shear specimens was 4000 psi. Repeating the same electrodeposition process, but omitting the cuprammonium treatment, the lap shears were 1600 psi.

X-ray microprobe analysis shows the presence of copper on the surface of the aluminum substrate after cuprammonium oxidation according to the invention, but it is not metallic copper. Indirect evidence indicates that the copper ion has deposited on the aluminum surface in a complex form, probably as a copper aluminate, analagous to sodium aluminate, but more insoluble and quite stable. This reactive cuprammonium ion is also capable of being formed from curpic chloride, cupric hydroxide, cupric acetate, cupric nitrate and other cupric salts. Furthermore, other bases, such as ethylene diamine, triethylamine and pyridine, for example, will also form stable complexes with cupric ions. Although these all form, and can be used, the preferred species is the cuprammonium ion; and, in particular, the cuprammonium ion formed from cupric sulfate.

Thus, the invention in its broad aspects is directed to a process for enhancing adhesive bonding of a metal substrate by the steps of treating said substrate to increase the surface area and to roughen said surface, and then applying an adhesive coating to said surface, wherein the essential feature comprises the step prior to adhesive bonding, of treating said substrate with a solution containing an ion of a metal having a lower electromotive force than said substrate metal, to cause said substrate metal to become oxidized and go into solution as an ion, the metal ion of said solution to deposit on said substrate in a complex form.

From the foregoing, it is seen that the process of the present invention particularly employing an aluminum substrate, and an ammoniacal solution of a copper salt, preferably copper sulfate, results in a uniform "etching" of the aluminum substrate and increases the surface area thereof to a uniform convoluted form, wherein the copper of the ammoniacal solution forms a compound with the aluminum surface, and providing improved adhesive bonding of an adhesive to the aluminum substrate with or without electrodeposition of an organic coating on the substrate surface prior to adhesive bonding. Thus, the novelty in the invention process resides in the ability to oxidize an aluminum surface by formation of a copper salt therewith, in preparation for adhesive bonding employing less stringent conditions than are normally encountered in making aluminum bondable. Furthermore, the difficulties encountered in the use of the process described in above application Ser. No. 317,162 of electrodeposition of polymers prior to adhesive bonding and in the absence of prior etching of the aluminum surface according to the present invention, are reduced, and more consistent and higher lap shear values are obtained.

What is claimed is:

1. In a process for enhancing adhesive bonding of an aluminum substrate by the steps of treating said substrate to increase the surface area and to roughen said surface, and then applying an adhesive coating to said surface, the improvement which comprises the step prior to adhesive bonding, of treating said substrate with a basic solution containing a complex ion of copper, to cause said substrate metal to become oxidized and go into solution as an ion, and the copper ion of said solution to deposit on said substrate in a complex form, and to form a copper salt with said aluminum substrate.

2. In a process for enhancing adhesive bonding of an aluminum substrate by the steps of treating said substrate to increase the surface area and to roughen said surface, and then applying an adhesive coating to said surface, the improvement which comprises the step prior to adhesive bonding, of treating said substrate with a complex basic solution of a copper salt selected from the group consisting of cupric sulfate, cupric chloride, cupric hydroxide, cupric acetate and cupric nitrate, said solution containing a complex ion of copper, to cause the aluminum of said substrate to become oxidized and to go into solution as an ion, and the copper ion of said solution to deposit on said substrate, and to form a copper salt with said aluminum substrate.

3. The process as defined in claim 2, wherein said basic solution is an ammoniacal solution or an ethylene diamine solution of said copper salt.

4. The process as defined in claim 3, wherein said solution is a cuprammonium solution containing the complex copper ammonia $(NH_3)_4^{++}$ ion.

5. The process as defined in claim 2, wherein said solution is an ammoniacal solution of copper sulfate, $[Cu(NH_3)_4^{++}SO_4]$.

6. A process for enhancing adhesive bonding to an aluminum substrate which comprises treating said substrate with an ammoniacal solution of a copper salt containing the complex ion $Cu(NH_3)_4^{++}$ for a period to uniformly increase the surface area of said substrate and roughening said substrate surface, aluminum from the metal substrate being oxidized and going into solution, and the copper ion being converted to a complex form and deposited on the substrate surface in the form of a copper aluminate, and applying an adhesive coating to said roughened substrate surface, said adhesive coating being chemically bonded to said substrate.

7. The process as defined in claim 6, said ammoniacal solution of a copper salt being a $[Cu(NH_3)_4^{++}]SO_4$ solution.

8. The process as defined in claim 6, the concentration of copper ion in said solution ranging from 0.001 to 1.5 molar.

9. The process as defined in claim 8, the ratio of ammonia to copper in said solution ranging from 2 to 1 to 8 to 1.

10. The process as defined in claim 8, the ratio of ammonia to copper in said solution ranging from 4 to 1 to 8 to 1.

11. The process as defined in claim 10, the ratio of ammonia to copper in said solution being the stoichiometric amount of 4 to 1.

12. The process as defined in claim 6, the concentration of copper ion in said solution ranging from 0.1 to 1.0 molar.

13. The process as defined in claim 6, which comprises the step prior to adhesive bonding, of subjecting said substrate to electrodeposition of a coating of an organic compound or polymer on said substrate and the formation of a chemical bond between said substrate and the coating, thereby enhancing adhesive bonding to the metal substrate.

14. The process as defined in claim 13, said electrodeposition reaction comprising passing an electric current through a non-aqueous electrolyte in which said aluminum substrate is the anode, the aluminum of said substrate being capable of forming an organometallic compound, said electrolyte containing an organic compound having a labile hydrogen, and capable of generating an anion during electrolysis, and an inert organic solvent for said compound, and electrodepositing a coating of said compound on said metal substrate, wherein said anion is reacted with and is chemically bonded to the metal of said substrate.

15. The process as defined in claim 14, wherein said organic compound is selected from the class consisting of (a) carboxyl substituted aminosilanes, (b) butylamine reaction products with phthalic anhydride, decylamine reaction products with phthalic anhydride, and carboxyl terminated butadieneacrylonitrile copolymer, and (c) phenyl phosphonic acid, and dimethyl phosphite, as their triethylamine salts, and sulfonic acid compounds.

16. The process as defined in claim 13, wherein said organic compound is a phosphorylated amide having a labile hydrogen, and capable of generating an anion during electrolysis, said phosphorylated amide being in the form of (a) an organic polymer consisting of a poly (phosphinohydrazide), a poly (phosphinoguanide) or a poly (phosphinoureide), including homopolymers and copolymers thereof, and their thio analogs, or (b) a 2:1 molar adduct of two moles of a nitrogen-containing compound of the group consisting of hydrazine, guanidine and urea, and its thio analog, to one mole of an organic phosphite or phosphonate, and their thio analogs, and electrodepositing a coating of said amide on said metal substrate wherein said anion is reacted with and is chemically bonded to the metal of said substrate.

17. The process as defined in claim 13, said electrodeposition of said organic compound being carried out in a non-aqueous solution of an organic compound which is the reaction product of one mole of dimethylphosphite with one mole of hydrazine hydrate.

18. The process as defined in claim 13, said electrodeposition of said organic compound being carried out in a non-aqueous solution of an organic compound which is the reaction product of one mole of dimethylphosphite with two moles of hydrazine hydrate.

19. The process as defined in claim 6, which comprises pretreating said substrate, prior to treatment thereof with said ammoniacal solution, with an alkaline solution.

20. The process as defined in claim 19, said alkaline solution being an alkali hydroxide solution.

21. The process as defined in claim 19, said alkaline solution being a soapy material containing a phosphate other than trisodium phosphate.

22. The process as defined in claim 6, which comprises pretreating said substrate, prior to treatment thereof with said ammoniacal solution, with a mixture of dichloromethane and isopropyl alcohol, or with methyl ethyl ketone, and thereafter treating said substrate with caustic alkali.

23. The process as defined in claim 6, which comprises pretreating said substrate, prior to treatment thereof with said ammoniacal solution, with methyl ethyl ketone followed by treatment with a soapy material containing a phosphate other than trisodium phosphate, followed by treatment with NaOH solution.

24. The process is defined in claim 6, which comprises pretreating said substrate, prior to treatment thereof with said ammoniacal solution, with methyl ethyl ketone, or with a mixture of dichoromethane and isopropyl alcohol, followed by treatment with NaOH solution, and then with an acid solution from the group consisting of nitric acid, phosphoric acid, acetic acid, and sulfuric acid.

25. The process as defined in claim 6, which comprises pretreating said substrate, prior to treatment thereof with said ammoniacal solution, with methyl ethyl ketone, followed by treatment with NaOH solution, and then with ammonium hydroxide solution.

* * * * *